United States Patent
Park

(10) Patent No.: US 12,113,083 B2
(45) Date of Patent: Oct. 8, 2024

(54) IMAGE SENSING DEVICE INCLUDING PROTECTION DEVICE

(71) Applicant: SK hynix Inc., Icheon-si (KR)

(72) Inventor: Soon Yeol Park, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 547 days.

(21) Appl. No.: 17/322,613

(22) Filed: May 17, 2021

(65) Prior Publication Data
US 2022/0020788 A1    Jan. 20, 2022

(30) Foreign Application Priority Data
Jul. 20, 2020   (KR) .................. 10-2020-0089719

(51) Int. Cl.
*H01L 27/146*   (2006.01)

(52) U.S. Cl.
CPC .... *H01L 27/1463* (2013.01); *H01L 27/14643* (2013.01)

(58) Field of Classification Search
CPC ........... H01L 27/1463; H01L 27/14643; H01L 27/14601; H01L 27/14609; H01L 27/14605; H01L 27/0248–0296; H01L 27/0292; H01L 27/14612; H01L 27/14603; H01L 27/14698; H01L 27/146–14893; H01L 27/1057; H01L 27/14812; H01L 27/14689; H01L 27/0652; H01L 27/0658; H01L 27/0664; H01L 27/0716; H01L 27/0755–0777; H01L 27/0821; H01L 27/0823–0828; H01L 27/067; H01L 27/0722; H01L 27/0783; H01L 29/66106; H01L 29/7808; H01L 29/7821; H01L 29/866; H01L 29/12035; H01L 29/7313; H01L 29/765–76891; H01L 29/66946–66962; H01L 29/0808;
(Continued)

(56) References Cited

U.S. PATENT DOCUMENTS

| | | | | |
|---|---|---|---|---|
| 6,163,446 A | * | 12/2000 | Norstrom | H01L 27/0248 361/111 |
| 10,935,658 B2 | | 3/2021 | Park et al. | |
| 2011/0216000 A1 | * | 9/2011 | Raynor | G06F 3/042 345/157 |

(Continued)

FOREIGN PATENT DOCUMENTS

KR   20190094341 A   8/2019

*Primary Examiner* — Cuong B Nguyen
*Assistant Examiner* — Anthony A Pulatov
(74) *Attorney, Agent, or Firm* — Perkins Coie LLP

(57) ABSTRACT

An image sensing device comprising a plurality of unit photosensing pixels to convert light into electrical signals, each unit photosensing pixel including a photosensor and a plurality of transistors to perform operations associated with the photosensor and a plurality of protection devices, each of which is coupled to any one of the plurality of transistors, wherein each of the plurality of protection devices includes a first region doped with a first type of conductive impurities, a second region doped with a second type of conductive impurities and surrounding the first region, and a third region doped with the first type of conductive impurities and surrounding the second region, wherein the first region includes a contact portion and a first well located below the contact portion, and wherein the contact portion has a higher doping density than the first well, and is coupled to any one of the plurality of transistors.

15 Claims, 9 Drawing Sheets

(58) Field of Classification Search
CPC ... H01L 29/6625; H01L 29/0804–0817; H01L 29/1004–1008; H01L 29/0821–0826; H01L 29/737–7378; H01L 29/66242; H01L 29/66318; H01L 29/0619–0623; H01L 31/11–1105; H01L 31/1123; H01L 31/1126; H01L 31/1129; H01L 31/1136; H01L 31/1013; H01L 31/1016; H01L 31/145–153; H01L 31/165–173; H01L 31/00–208; H01L 2924/13053; H01L 2924/13065; H01L 2924/732–7327; H01L 2924/7371–7378; H01L 2924/13051; H01L 2924/12035; H01L 21/823406; H01L 21/8224; H01L 21/82285; H01L 23/60; H01L 23/62; H01L 23/552–556; H04N 25/76; H04N 25/70; G01S 17/00–95; H10K 30/87; H02S 50/00–15

See application file for complete search history.

(56) References Cited

U.S. PATENT DOCUMENTS

| | | | |
|---|---|---|---|
| 2013/0123015 A1 | 5/2013 | Jung et al. | |
| 2016/0300830 A1* | 10/2016 | Salcedo | H01L 27/0262 |
| 2016/0356718 A1 | 12/2016 | Yoon et al. | |
| 2018/0082994 A1* | 3/2018 | Han | H01L 27/0274 |
| 2018/0182747 A1* | 6/2018 | Kim | H10B 61/00 |
| 2019/0148446 A1* | 5/2019 | Shimotsusa | H01L 27/14636 257/228 |
| 2019/0181133 A1 | 6/2019 | Hiblot et al. | |
| 2019/0230304 A1 | 7/2019 | Moore et al. | |
| 2019/0310351 A1 | 10/2019 | Hughes et al. | |
| 2020/0098799 A1* | 3/2020 | Tsai | H01L 27/14627 |
| 2020/0264311 A1 | 8/2020 | Le Dortz et al. | |
| 2020/0314347 A1 | 10/2020 | Kageyama et al. | |
| 2021/0341616 A1 | 11/2021 | Saito | |
| 2022/0262832 A1* | 8/2022 | Okamoto | H01L 27/14605 |

* cited by examiner

IMAGE SENSING DEVICE INCLUDING PROTECTION DEVICE

CROSS-REFERENCE TO RELATED APPLICATION

This patent document claims the priority and benefits of Korean patent application No. 10-2020-0089719, filed on Jul. 20, 2020, the disclosure of which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert light of optical images into electrical signals. Image sensing devices may be broadly classified into CCD (Charge Coupled Device)-based image sensing devices and CMOS (Complementary Metal Oxide Semiconductor)-based image sensing devices.

The CMOS image sensing devices fabricated using CMOS fabrication technology are smaller in size and consume less power than the CCD image sensors. As a result, CMOS image sensing devices dominate the consumer market for electronic devices having optical cameras and video cameras.

SUMMARY

Various embodiments of the disclosed technology relate to a protection device in unit pixels of an image sensing device that is structured to effectively remove electric charges stored in a gate of transistors in the unit pixels during a plasma process.

Various embodiments of the disclosed technology relate to a protection device in unit pixels of an image sensing device that is structured to have a high breakdown voltage, such that the protection device does not affect the operation of the protected transistor.

In an embodiment of the disclosed technology, an image sensing device comprising a plurality of unit photosensing pixels structured to convert light into electrical signals, each unit photosensing pixel including a photosensor and a plurality of transistors structured to perform operations associated with the photosensor and a plurality of protection devices, each of which is coupled to any one of the plurality of transistors, wherein each of the plurality of protection devices includes a first region doped with a first type of conductive impurities, a second region doped with a second type of conductive impurities and surrounding the first region, and a third region doped with the first type of conductive impurities and surrounding the second region, wherein the first region includes a contact portion and a first well located below the contact portion, and wherein the contact portion has a higher doping density than the first well, and is coupled to any one of the plurality of transistors.

In some implementations, the first type of conductive impurities is P-type impurities and the second type of conductive impurities is N-type impurities.

In some implementations, the second region includes a floating portion, a second well located below the floating portion, and a first deep well located below the second well, wherein the floating portion has a higher doping density than the second well.

In some implementations, the image sensing device may further include a shallow trench isolation (STI) structure arranged between the contact portion and the floating portion and structured to isolate the contact portion and the floating portion from each other.

In some implementations, wherein the third region includes a ground voltage terminal portion, a third well located below the ground voltage terminal portion, and a second deep well located below the third well, wherein the ground voltage terminal portion has a higher doping density than the third well.

In some implementations, the third well is arranged to contact the second well and the contact portion has a higher doping density than the third well.

In some implementations, the image sensing device may further include a shallow trench isolation (STI) structure by which the floating portion and the contact portion are isolated from each other.

In some implementations, each of the plurality of transistors is any one of a transfer transistor, a selection transistor, and a reset transistor.

In some implementations, the image sensing device may further include an isolation region disposed between a region in which the plurality of protection devices are disposed and a region in which the unit pixel is disposed.

In some implementations, the isolation region includes a first isolation portion doped with the first type of conductive impurities, wherein the first isolation portion is grounded.

In some implementations, the isolation region may further include a second isolation portion doped with the second type of conductive impurities. wherein the second isolation portion is disposed between a region in which the first isolation portion is disposed and a region in which the plurality of protection devices are disposed.

In some implementations, the second isolation portion is grounded.

In some implementations, the second isolation portion may be configured to receive a positive (+) voltage.

In another embodiment of the disclosed technology, an image sensing device may include a plurality of photosensors structured to convert light into electrical signals, a plurality of transistors structured to perform operations associated with the plurality of photosensors and a plurality of protection devices structured to carry electric charges accumulated in the transistors by connecting to gates of the transistors, wherein the protection device include a contact portion doped with P-type impurities, a first well doped with the P-type impurities, and formed below the contact portion, a second well doped with N-type impurities, and formed to contact the first well by surrounding the first well and a first deep well doped with the N-type impurities, and formed below the second well, wherein the first deep well is formed between the semiconductor substrate and the first well and each of the first well and the second well is doped with a lower density than the contact portion.

In some implementations, the protection device includes a third well doped with the P-type impurities, and formed to contact the second well by surrounding the second well and a second deep well doped with the P-type impurities, and formed below the third well.

In another embodiment of the disclosed technology, an image sensing device may include a plurality of photosensors structured to convert light into electric charges, a plurality of first devices structured to accumulate the electric charges generated by plurality of photosensors and a plurality of second devices structured to carry the electric charges accumulated in the plurality of first devices, wherein each of the plurality of second devices includes a first region doped with a first type of conductive impurities, a second region doped with a second type of conductive impurities and surrounding the first region and a third region doped with the first type of conductive impurities and surrounding the second region, wherein the first region includes a contact portion and a first well located below the contact portion, and wherein the contact portion has a higher doping density than the first well, and is coupled to any one of the plurality of first devices.

In some implementations, the first type of conductive impurities is P-type impurities and the second type of conductive impurities is N-type impurities.

In some implementations, the second region includes a floating portion, a second well located below the floating portion, and a first deep well located below the second well, wherein the floating portion has a higher doping density than the second well.

In some implementations, the second well is arranged to contact the first well and the contact portion has a higher doping density than the second well.

In another embodiment of the disclosed technology, an image sensing device may include a unit pixel provided with first to N-th protected transistors (where 'N' is an integer of 2 or more), and first to N-th protection devices, each of which is coupled to any one of the first to N-th protected transistors. Each of the first to N-th protection devices may include a first region doped with a first type of conductive impurities, a second region doped with a second type of conductive impurities by surrounding the first region, and a third region doped with the first type of conductive impurities by surrounding the second region. The first region may include a contact portion and a first well located below the contact portion. The contact portion may have a higher doping density than the first well, and may be coupled to any one of the first to N-th protected transistors.

In another embodiment of the disclosed technology, an image sensing device may include an image sensing device may include a plurality of protected transistors disposed in a pixel array, and a protection device configured to transmit charges accumulated in the protected transistors to a semiconductor substrate by connecting to gates of the protected transistors. The protection device may include a contact portion doped with P-type impurities, a first well doped with the P-type impurities, and formed below the contact portion, a second well doped with N-type impurities, and formed to contact the first well by surrounding the first well, and a first deep well doped with the N-type impurities, and formed below the second well. The first deep well may be formed between the semiconductor substrate and the first well. Each of the first well and the second well may be doped with a lower density than the contact portion.

It is to be understood that both the foregoing general description and the following detailed description of the disclosed technology are illustrative and explanatory and are intended to provide further explanation of the disclosure as claimed.

DETAILED DESCRIPTION

Figure 1:
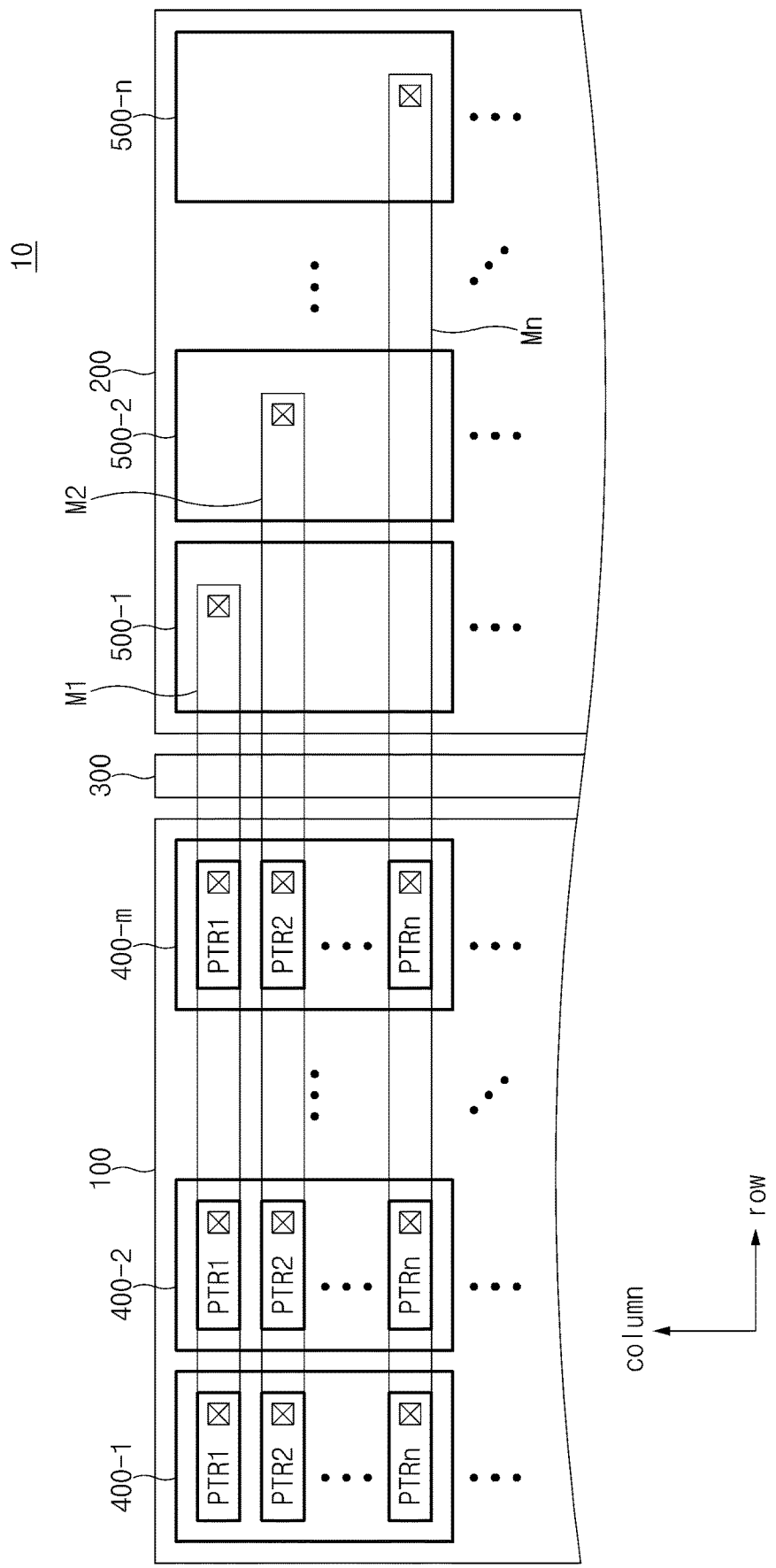
FIG. 1 is a schematic diagram illustrating an example of an image sensing device based on some implementations of the disclosed technology.

This patent document provides implementations and examples of an image sensing device including a protection device and the disclosed features may be implemented to substantially address one or more issues due to limitations and disadvantages of various image sensing devices each including a protection device. Some implementations of the disclosed technology relate to a protection device configured to effectively remove electric charges stored in a gate of a protected transistor during a plasma process, and configured to have a high breakdown voltage to avoid affecting the operation of a protected transistor. The disclosed technology provides various implementations of an image sensing device provided with the protection device, which can effectively protect the protected transistor during the plasma process and does not affect the operation of the protected transistor.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments.

A plasma process is frequently used in manufacturing semiconductor devices such as CMOS image sensing devices. For example, the plasma process may be used in various processes, such as dielectric material deposition, dielectric material etching, metal etching, photoresist removal, and metal deposition through sputtering.

However, electric charges generated by plasma may be accumulated in a restricted area such as gates of transistors in the semiconductor devices, and a high electric field caused by the accumulated electric charges may alter electrical characteristics of the device.

Specifically, during a Back End Of Line (BEOL) process, interconnects between transistors in the CMOS image sensing device are not properly connected, causing electric charges to be accumulated in a gate of the transistor and flow to a gate oxide film.

In some implementations, a protection device such as a diode or a Bipolar Junction Transistor (BJT) may be used to protect transistor gates during the plasma process.

However, the protection device may affect the sensing operation of the image sensing device because of the breakdown voltage characteristics. For example, if the breakdown voltage range is small, operating voltages of the transistors to be protected by the protection device may be restricted, and the sensitive reaction of the protection device to the amount of photocharges generated by photodiodes of the image sensing device can affect the operational characteristics of the image sensing device.

FIG. 1 is a schematic diagram illustrating an example of an image sensing device 10 based on some implementations of the disclosed technology.

Referring to FIG. 1, the image sensing device 10 based on some implementations of the disclosed technology may include a pixel array 100 in which unit pixels 400-1 to 400-m (where 'm' is an integer of 2 or more) each including a plurality of protected transistors PTR1-PTRn (where 'n' is an integer of 2 or more) are arranged in a matrix array, a protection device region (also called a protection device area) 200 in which protection devices (500-1, 500-2, . . . 500-n) for protecting the protected transistors PTR1-PTRn from damage caused by plasma are arranged in a matrix array, and an isolation region 300 configured to isolate the pixel array 100 and the protection device region 200 from each other. In this patent document, the term "protected transistor" can be used to indicate any transistors arranged in unit pixels of the image sensing device 10 that is protected by the protection device region during a device fabrication process including a plasma process. In some implementations, the term "protected transistor" can be used to indicate any structures and devices disposed in unit pixels such as transistors, diodes, junctions, electric charge reservoirs, and others.

The unit pixels 400-1 to 400-m may be arranged in a matrix array on the pixel array 100. The unit pixels 400-1 to 400-m included in the pixel array 100 may be constructed in a shared pixel structure. For example, each of the unit pixels 400-1 to 400-m may be formed in a shared pixel structure in which four photodiodes (not shown) are coupled to a single floating diffusion (FD) region (not shown) through first to fourth transfer transistors (not shown). In some implementations, the first photodiode from among the four photodiodes may be coupled to the single floating diffusion (FD) region through the first transfer transistor, the second photodiode from among the four photodiodes may be coupled to the single floating diffusion (FD) region through the second transfer transistor, the third photodiode from among the four photodiodes may be coupled to the single floating diffusion (FD) region through the third transfer transistor, and the fourth photodiode from among the four photodiodes may be coupled to the single floating diffusion (FD) region through the fourth transfer transistor.

For convenience of description, protected transistors included in each unit pixel 400 will hereinafter be denoted by PTR1 to PTRn, respectively. The protected transistors PTR1 to PTRn may be coupled to the protection devices 500-1 to 500-n through metal lines M1 to Mn, respectively. In some implementations, the protected transistor PTR1 may be coupled to the protection device 500-1 through the metal line M1, the protected transistor PTR2 may be coupled to the protection device 500-2 through the metal line M2, and the protected transistor PTRn may be coupled to the protection device 500-n through the metal line Mn.

The protection devices 500-1 to 500-n may be arranged in a matrix array in the protection device region 200. From among the protected transistors PTR1 to PTRn included in each of the unit pixels 400-1 to 400-m, the same kind of protected transistors (i.e., any one of PTR1 to PTRn) in the unit pixels 400-1 to 400-m disposed in the same row may be coupled to any one of the protection devices 500-1 to 500-n.

The same kind of protected transistors (i.e., any one of PTR1 to PTRn) may refer to transistors PTR1 to PTRn that are included in different unit pixels 400-1 to 400-m and perform the same function upon receiving the same control signal through a single signal line.

For example, the first protected transistors (PTR1s) respectively disposed in different unit pixels 400-1 to 400-m may be electrically coupled to the first protection device 500-1 through the first metal line M1. Each of the first protected transistors (PTR1s) may be any one of transfer transistors included in the unit pixels 400-1 to 400-m.

In this case, the first protected transistors (PTR1s) disposed in different unit pixels 400-1 to 400-m may refer to transistors that perform the same function upon receiving the same signal through only one signal line. Here, the transistors may transmit charges stored in each photodiode (not shown) arranged at the corresponding position in each of the unit pixels 400-1 to 400-m to the floating diffusion (FD) region.

Each of the protected transistors PTR1 to PTRn may be any one of transistors included in the unit pixels 400-1 to 400-m. For example, the unit pixels 400-1 to 400-m included in the pixel array 100 may include the transfer transistors, a selection transistor, a reset transistor, and others. The above-mentioned transistors may be used as protected transistors PTR1 to PTRn of the protection devices 500-1 to 500-n.

In the protection device region 200, the number of protection devices 500-1 to 500-n arranged in one row may be identical to the number of protected transistors PTR1 to PTRn included in each of the unit pixels 400-1 to 400-m. Accordingly, a total number of protection devices 500-1 to 500-n disposed in the protection device region 200 may be denoted by a product of the number of rows on the pixel array 100 and the number of protected transistors PTR1 to PTRn included in each unit pixel.

In some implementations, the protection devices 500-1 to 500-n may be used to prevent a voltage higher than a reverse internal pressure of each of the protection devices 500-1 to 500-n from being applied to gates of the protected transistors PTR1 to PTRn in the plasma process.

Since high-energy ions are generated in the plasma process, an excessive amount of charges may be accumulated in gates of the protected transistors PTR1 to PTRn.

Each of the protected transistors PTR1 to PTRn may include a source/drain region and a channel region formed in a semiconductor substrate or an epitaxial layer. An oxide film (e.g., silicon oxide) may be formed at an upper portion of the channel region, and a gate formed of metal may be formed at an upper portion of the oxide film.

If electric charges are accumulated in gates of the protected transistors PTR1 to PTRn or interconnects or signal lines connected to gates of the protected transistors PTR1 to PTRn, those electric charges accumulated in gates may flow into the semiconductor substrate or the epitaxial layer after passing through the oxide film.

In this case, the oxide film may be damaged by the electric charges passing through the oxide film, undesirably altering voltage characteristics of the protected transistors PTR1 to PTRn and causing reliability degradation of the protected transistors PTR1 to PTRn.

In some implementations, the protection devices 500-1 to 500-n respectively coupled to gates of the protected transistors PTR1 to PTRn can protect the protected transistors PTR1 to PTRn from damages that could have occurred during the plasma process. In one example, the protection devices 500-1 to 500-n may provide protection by allowing the excessive amount of electric charges applied to the protected transistors PTR1 to PTRn to flow into the protection devices 500-1 to 500-n rather than the oxide film, thereby discharging the electric charges toward the semiconductor substrate through the protection devices 500-1 to 500-n.

Each of the protection devices 500-1 to 500-n may be arranged such that a region doped with first conductive impurities and a region doped with second conductive impurities are alternately arranged. In addition, one region doped with one type of conductive impurities may be arranged to surround the other region doped with the other type of conductive impurities, as will be discussed below with reference to FIGS. 2 to 5.

During the operation of the image sensing device 10, a signal voltage having an activation level (e.g., a voltage level for activating a transistor) or a signal voltage having a deactivation level (e.g., a voltage level for deactivating a transistor) may be applied to gates of the protected transistors PTR1 to PTRn, such that a voltage equal to the voltage applied to the gates of the protected transistors PTR1 to PTRn may be applied to the protection devices 500-1 to 500-n respectively connected to the gates of the protected transistors PTR1 to PTRn.

In this case, if the breakdown voltage of the protection devices 500-1 to 500-n are not sufficiently high, excessive leakage current may unexpectedly occur between the protection devices 500-1 to 500-n and the gates of the protected transistors PTR1 to PTRn during the sensing operation, resulting in occurrence of noise in the sensing operation. When a voltage higher than the breakdown voltage range is applied to the protection devices 500-1 to 500-n, the breakdown phenomenon of the protection devices 500-1 to 500-n may result in an excessive leakage current.

In addition, the characteristics of the protection devices 500-1 to 500-n may affect a doping profile of each photodiode.

The doping profile of each photodiode may include structural and physical characteristics associated with doping of the photodiode. A doping density and doping layout of the epitaxial layer constructing the photodiode can be examples of the doping profile.

When the transfer transistor is used to carry electric charges, a signal voltage applied to a gate of the transfer transistor may be affected by the doping density and doping layout of the photodiode. In addition, when each of the protection devices 500-1 to 500-n fails to provide a sufficiently wide constant-current voltage range (i.e., a voltage range belonging to the breakdown voltage range) to maintain a constant current, the doping profile of the photodiode may be restricted.

The characteristics of the protection devices 500-1 to 500-n may vary depending on the doping density of doped regions included in the protection devices 500-1 to 500-n and whether or not a shallow trench isolation (STI) structure is present in the doped regions, as will be discussed below with reference to FIGS. 2 to 5.

The isolation region 300 may isolate the pixel array 100 and the protection device region 200 from each other. In order to isolate the pixel array 100 and the protection device region 200 from each other, the isolation region 300 may be disposed between the protection device region 200 and the pixel array 100.

The protection device region 200 may be used as a region through which electric charges accumulated in gates of the protected transistors PTR1 to PTRn move during the plasma process, and thus a high voltage created by the accumulated electric charges may be applied to the protection device region 200. If the pixel array 100 and the protection device region 200 are not separated far enough from each other, such a high voltage may cause a leakage current, resulting in damages to the devices and/or metal lines in the image sensing device 10.

Accordingly, there is a need for the pixel array 100 and the protection device region 200 to be properly isolated from each other by the isolation region 300. In some implementations, the distance between the pixel array 100 and the protection device region 200 may be set to, for example, 10 µm or more.

Although the isolation region 300 may be doped with the same conductive impurities as those of the semiconductor substrate, the scope of the disclosed technology is not limited thereto, and the isolation region 300 may include an isolation portion doped with different types of conductive impurities as necessary. Examples of the isolation region 300 will be discussed below with reference to FIGS. 7 to 9.

Figure 2:
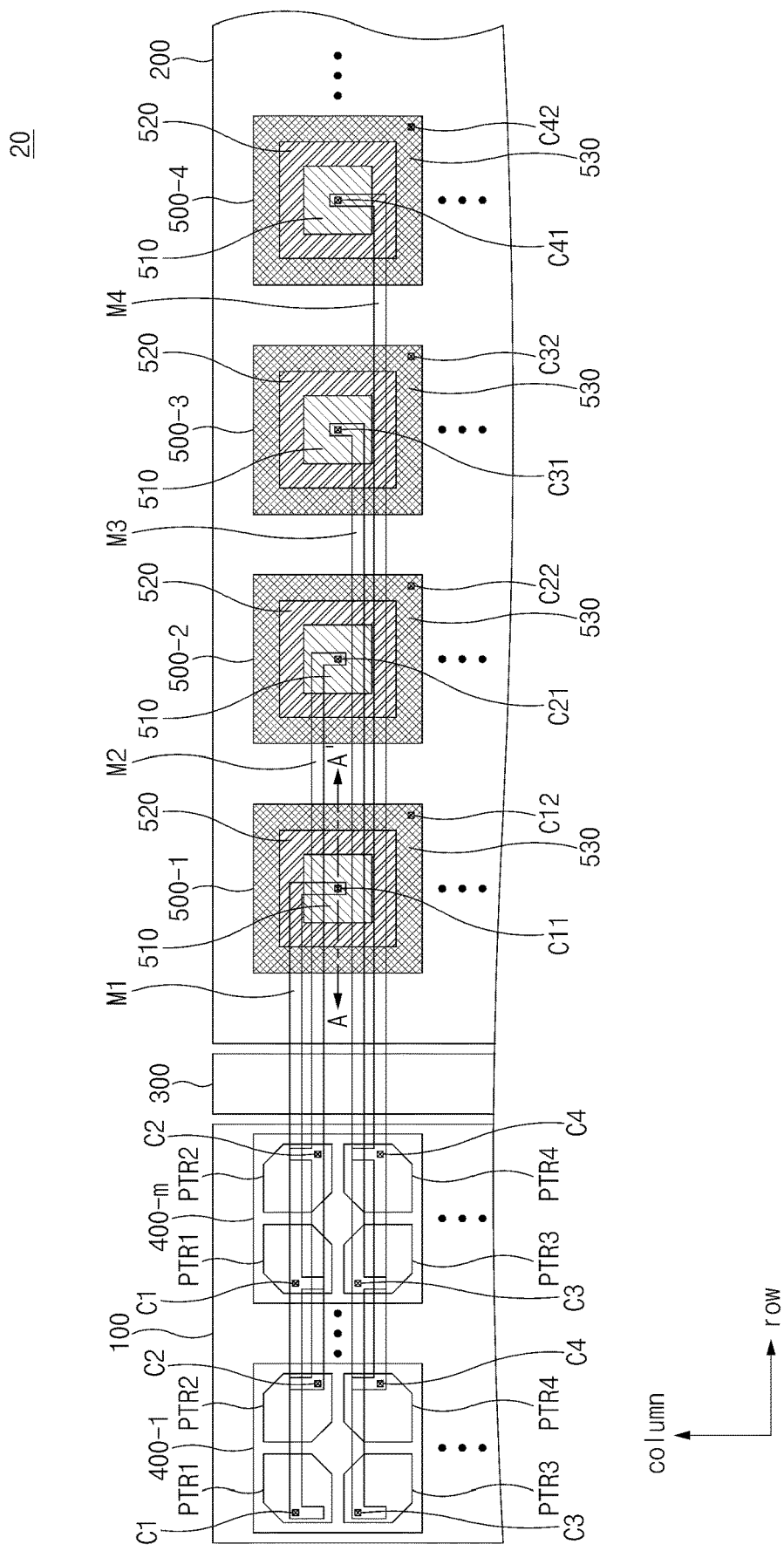
FIG. 2 is a schematic diagram illustrating an example of an image sensing device based on some implementations of the disclosed technology.

FIG. 2 is a schematic diagram illustrating an example of the image sensing device 10 based on some implementations of the disclosed technology.

FIG. 2 illustrates the unit pixels 400-1 to 400-m for use in the pixel array 100. For convenience of description, the details as to other constituent elements included in the unit pixels 400-1 to 400-m will not be discussed, and the discussion here will focus on the first to fourth protected transistors PTR1 to PTR4 from among the protected transistors PTR1 to PTRn included in each unit pixel are briefly shown in FIG. 2. In some implementations, the first to fourth protected transistors PTR1 to PTR4 may be implemented as transfer transistors.

Although the transistor includes a gate, a source, a drain, an oxide film, and a channel region, the discussion below will indicate gates of the first to fourth protection devices PTR1 to PTR4 as the first to fourth protected transistors PTR1 to PTR4 for convenience of description.

In addition, FIG. 2 illustrates the first metal line M1 connected to the gate of the first protected transistor PTR1, the second metal line M2 connected to the gate of the second protected transistor PTR2, the third metal line M3 connected to the gate of the third protected transistor PTR3, and the fourth metal line M4 connected to the gate of the fourth protected transistor PTR4.

The first to fourth metal lines M1 to M4 may be at signal line layer or interconnect layers of the image sensing device 10.

A first gate contact C1 may couple the first metal line M1 to the gate of the first protected transistor PTR1. A second gate contact C2 may couple the second metal line M2 to the gate of the second protected transistor PTR2. A third gate contact C3 may couple the third metal line M3 to the gate of the third protected transistor PTR3. A fourth gate contact C4 may couple the fourth metal line M4 to the gate of the fourth protected transistor PTR4.

The first to fourth metal lines M1 to M4 may extend to the protection device region 200 in a row direction of the unit pixels 400-1 to 400-m after sequentially passing through the pixel array 100 and the isolation region 300. Although FIG. 2 illustrates only the first to fourth metal lines M1 to M4 respectively coupled to the first to fourth protected transistors PTR1 to PTR4 for convenience of description, the scope of the disclosed technology is not limited thereto, and the image sensing device 10 may further include metal lines (not shown) according to the number of protected transistors as necessary.

As described above, the first to fourth metal lines M1 to M4 may be coupled in common to the same kind of protected transistors (i.e., any one of PTR1 to PTR4) from among the protected transistors PTR1 to PTR4 included in the unit pixels 400-1 to 400-m that are contiguous or adjacent to each other in the row direction in the protection device region 200.

For example, the first protected transistors (PTR1s) included in the unit pixels 400-1 to 400-m may be coupled in common to the first metal line M1.

The first metal line M1 may be coupled to the first protection device 500-1 through a first device contact C11. The second metal line M2 may be coupled to the second protection device 500-2 through a second device contact C21. The third metal line M3 may be coupled to the third protection device 500-3 through a third device contact C31. The fourth metal line M4 may be coupled to the fourth protection device 500-4 through a fourth device contact C41.

Although each of the first to fourth metal lines M1 to M4 through which the first to fourth protected transistors PTR1 to PTR4 are respectively coupled to the first to fourth protection devices 500-1 to 500-4 is formed of two metal layers, the scope of the disclosed technology is not limited thereto, and each of the first to fourth metal lines M1 to M4 may be formed of at least two metal layers. In addition, the shapes of the first to fourth metal lines M1 to M4 may vary depending on a layout structure of the image sensing device 20.

In some implementations, the first to fourth protection devices 500-1 to 500-4 disposed in the protection device region 200 may be substantially identical in structure to each other.

When viewed from the direction perpendicular to one surface of the substrate, each of the first to fourth protection devices 500-1 to 500-4 may include a first region 510 doped with a first type of conductive impurities (i.e., first conductive impurities), a second region 520 doped with a second type of conductive impurities (i.e., second conductive impurities) and surrounding the first region 510, and a third region 530 doped with first conductive impurities and surrounding the second region 520.

The first regions 510 of the first to fourth protection devices 500-1 to 500-4 may be coupled to the first to fourth metal lines M1 to M4 through the device contacts C11 to C41, respectively. In some implementations, the first region 510 of the first protection device 500-1 may be coupled to the first metal line M1 through the device contact C11, the first region 510 of the second protection device 500-2 may be coupled to the second metal line M2 through the device contact C21, the first region 510 of the third protection device 500-3 may be coupled to the third metal line M3 through the device contact C31, and the first region 510 of the fourth protection device 500-4 may be coupled to the fourth metal line M4 through the device contact C41.

The second regions 520 of the first to fourth protection devices 500-1 to 500-4 may float.

The third regions 530 of the first to fourth protection devices 500-1 to 500-4 may be grounded by the first to fourth ground contacts C12, C22, C32, and C42, respectively.

When viewed from the direction perpendicular to one surface of the substrate, the doping profiles of the first to fourth protection devices 500-1 to 500-4 may be substantially identical to each other, and thus the discussion below will focus on the first protection device 500-1 for convenience of description.

The first region 510 may be doped with P-type impurities, the second region 520 may be doped with N-type impurities, and the third region 530 may be doped with P-type impurities. Accordingly, the first protection device 500-1 may have a PNP-type BJT (Bipolar Junction Transistor) structure.

The first region 510 of the first protection device 500-1 may be used as an emitter of the BJT, the second region 520 of the first protection device 500-1 may be used as a base of the BJT, and the third region 530 of the first protection device 500-1 may be used as a collector of the BJT. Detailed shapes and functions of the protection devices will be discussed below with reference to FIG. 3.

As such, the first to fourth protection devices 500-1 to 500-4 each having a BJT structure respectively coupled to the first to fourth protected transistors PTR1 to PTR4 may prevent a potential damage to the protected transistors during the plasma process by forming a bypass path along which electric charges are moving.

The isolation region 300 disposed between the pixel array 100 and the protection device region 200 may be doped with first conductive impurities, and the first conductive impurities may be P-type impurities. A cross-sectional shape of the isolation region 300 will be described later with reference to FIGS. 7 to 9.

Figure 3:
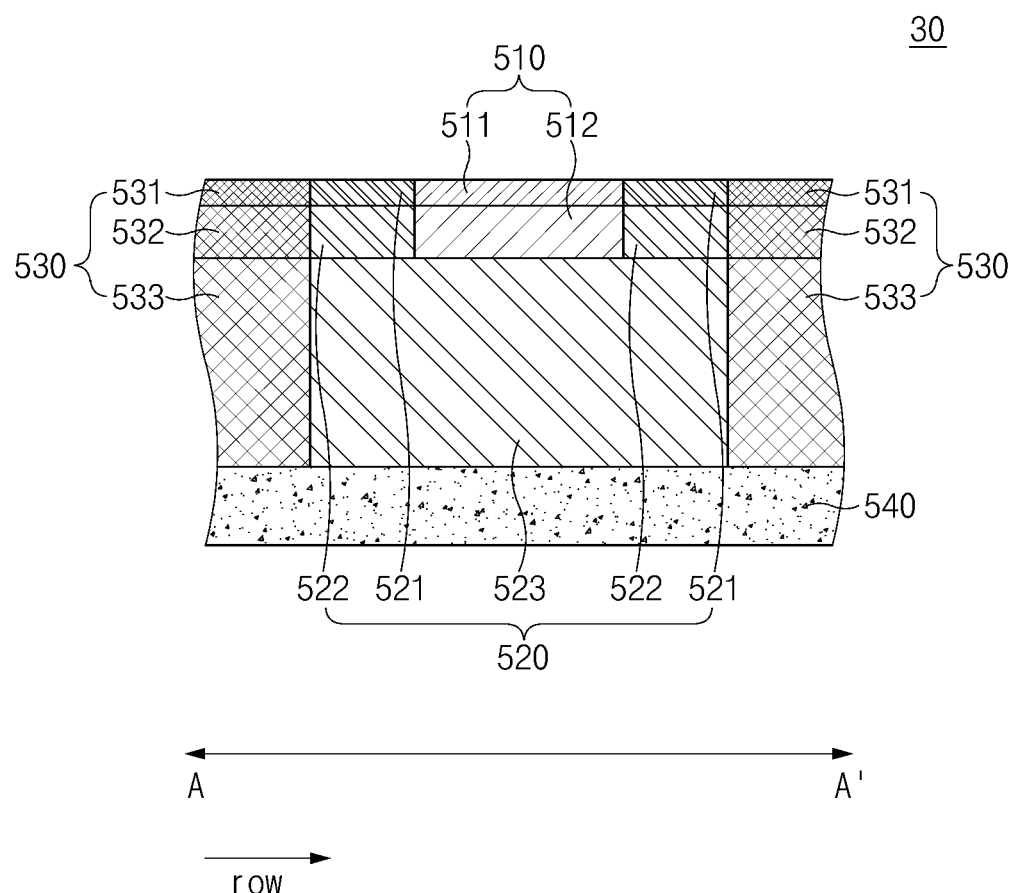
FIG. 3 is a cross-sectional view illustrating an example of a first protection device based on some implementations of the disclosed technology.

FIG. 3 is a cross-sectional view 30 illustrating an example of the first protection device 500-1 based on some implementations of the disclosed technology.

FIG. 3 is a cross-sectional view 30 illustrating an example of the first protection device 500-1 taken along a first cutting line A-A' shown in FIG. 2. Although the following description focuses on the first protection device 500-1 for convenience of description, the scope of the disclosed technology is not limited thereto, and in some implementations, other protection devices 500-2 to 500-n may be identical or similar in structure.

Referring to FIG. 3, the first protection device 500-1 may include the first region 510 doped with P-type impurities, the second region 520 doped with N-type impurities, and the third region 530 doped with P-type impurities. The second region 520 may be formed to surround the first region 510. The third region 530 may be formed to surround the second region 520.

The first region 510 may include a contact portion 511 and a first well 512.

The contact portion 511 may be coupled to the gate of the first protected transistor PTR1 through the first metal line M1. The contact portion 511 may be doped with high-density impurities to reduce resistance between the contact portion 511 and the first metal line M1. In some implementations, the contact portion 511 may be doped with P-type impurities constructing a shallow junction structure.

The first well 512 may have a lower doping density than the contact portion 511.

The contact portion 511 and the first well 512 may be doped with the same type of impurities, such that the entirety of the first region 510 may serve as the emitter of the BJT.

The second region 520 may include a floating portion 521, a second well 522, and a first deep well 523. The floating portion 521 may have a higher doping density than the second well 522. In some implementations, the floating portion 521 may be doped with N-type impurities constructing a shallow junction structure. The floating diffusion region 521 may float in a manner that electric potential is not fixed.

The second well 522 may have a lower doping density than the contact portion 511. The first well 512 and the second well 522 may have similar doping densities.

The first well 512 having a relatively lower doping density than the contact portion 511 may be arranged to contact the second well 522 having a relatively lower doping density than the floating portion 521, such that the breakdown voltage range of the first protection device 500-1 may increase.

In some implementations, the first well 512 may be a P-type region having a lower doping density, and the second well 522 may be an N-type region having a lower doping density. The second region 520 formed to surround the first region 510 may serve as the base of the BJT.

The first deep well 523 disposed below the second well 522 may be doped with N-type impurities, and may have a lower doping density than the second well 522.

The third region 530 may include a ground voltage terminal portion 531, a third well 532, and a second deep well 533. The ground voltage terminal portion 531 may have a higher doping density than the third well 532. The third region 530 may serve as the collector of the BJT. In some implementations, the ground voltage terminal portion 531 may be doped with P-type impurities constructing a shallow junction structure. The second deep well 533 disposed below the third well 532 may be doped with P-type impurities, and may have a lower doping density than the third well 532.

The ground voltage terminal portion 531 may be grounded by connecting to the ground contact C21, such that holes generated by the first protection device 500-1 can be captured.

A semiconductor substrate 540 may be disposed below the first deep well 523 and the second deep well 533. The semiconductor substrate 540 may be a silicon substrate doped with first conductive impurities. In some implementations, the semiconductor substrate 540 may be a silicon substrate doped with P-type impurities.

Figure 4:
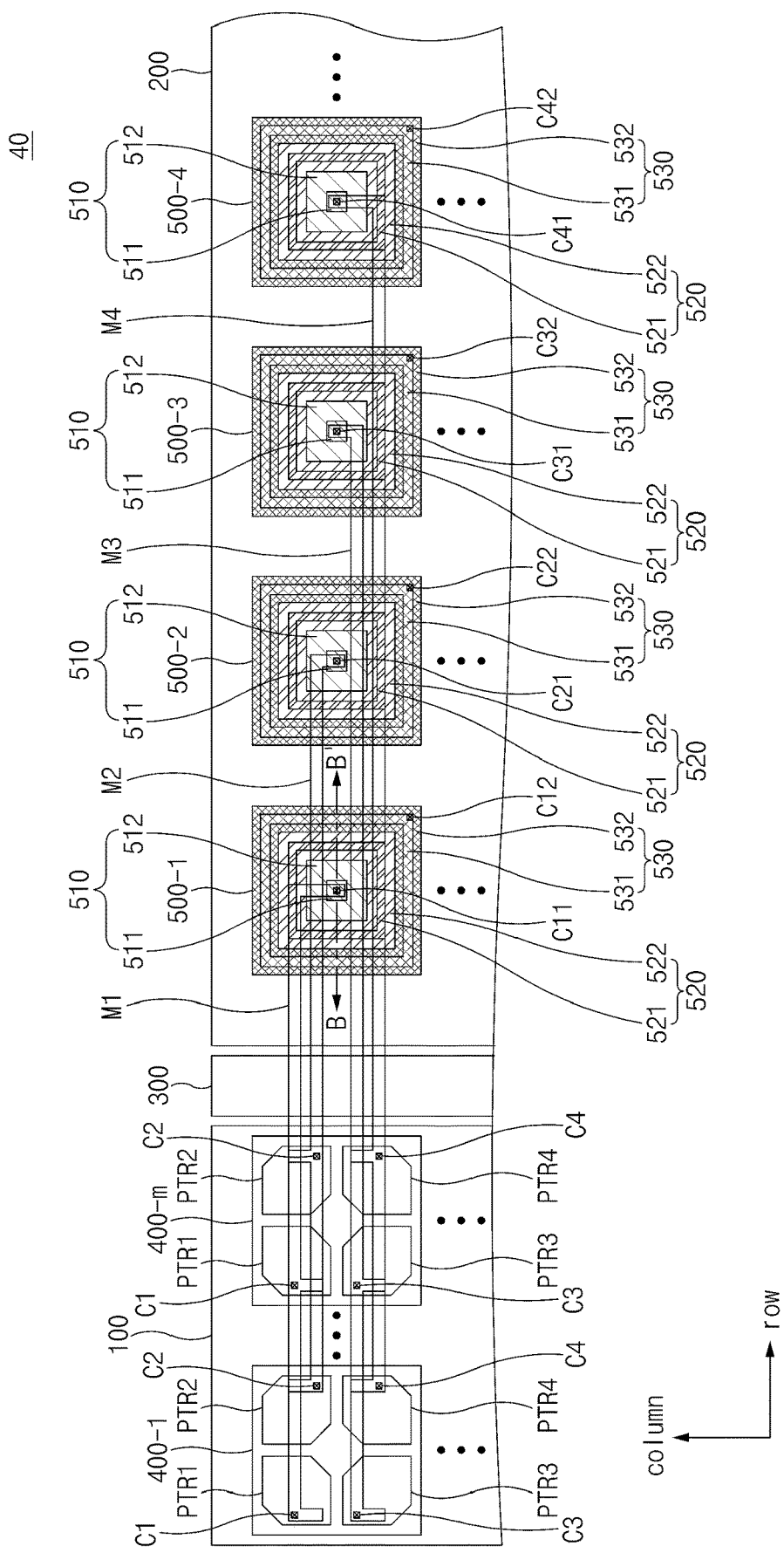
FIG. 4 is a schematic diagram illustrating an example of an image sensing device based on some implementations of the disclosed technology.

FIG. 4 is a schematic diagram illustrating an example of an image sensing device 40 based on some implementations of the disclosed technology.

Referring to FIG. 4, the details as to the remaining components of the image sensing device 40 other than the first to fourth protection devices 500-1 to 500-4 different from those of FIG. 2 may be identical or similar in structure to those of the image sensing device 20 shown in FIG. 2.

When viewed from the direction perpendicular to one surface of the substrate, each of the first to fourth protection devices 500-1 to 500-4 shown in FIG. 4 may include a first region 510 doped with first conductive impurities, a second region 520 doped with second conductive impurities and surrounding the first region 510, and a third region 530 doped with first conductive impurities and surrounding the second region 520.

The first region 510 may include a contact portion 511 doped with first conductive impurities having high density, and a first well 512 doped with first conductive impurities having low density.

The second region 520 may include a floating portion 521 doped with second conductive impurities having high density, and a second well 522 doped with second conductive impurities having low density.

The third region 530 may include a ground voltage terminal portion 531 doped with first conductive impurities having high density, and a third well 532 doped with first conductive impurities having low density.

Differently from FIG. 2, a first shallow trench isolation (STI) structure may be formed between the first region 510 and the second region 520, and a second shallow trench isolation (STI) structure may be formed between the second region 520 and the third region 530 as shown in FIG. 4. Each of the first STI structure and the second STI structure may be filled with an insulation material (e.g., silicon oxide, silicon nitride, or the like).

In some implementations, characteristics of the protection devices can be affected by the first STI structure and the second STI structure as will be discussed below with reference to FIG. 5.

Figure 5:
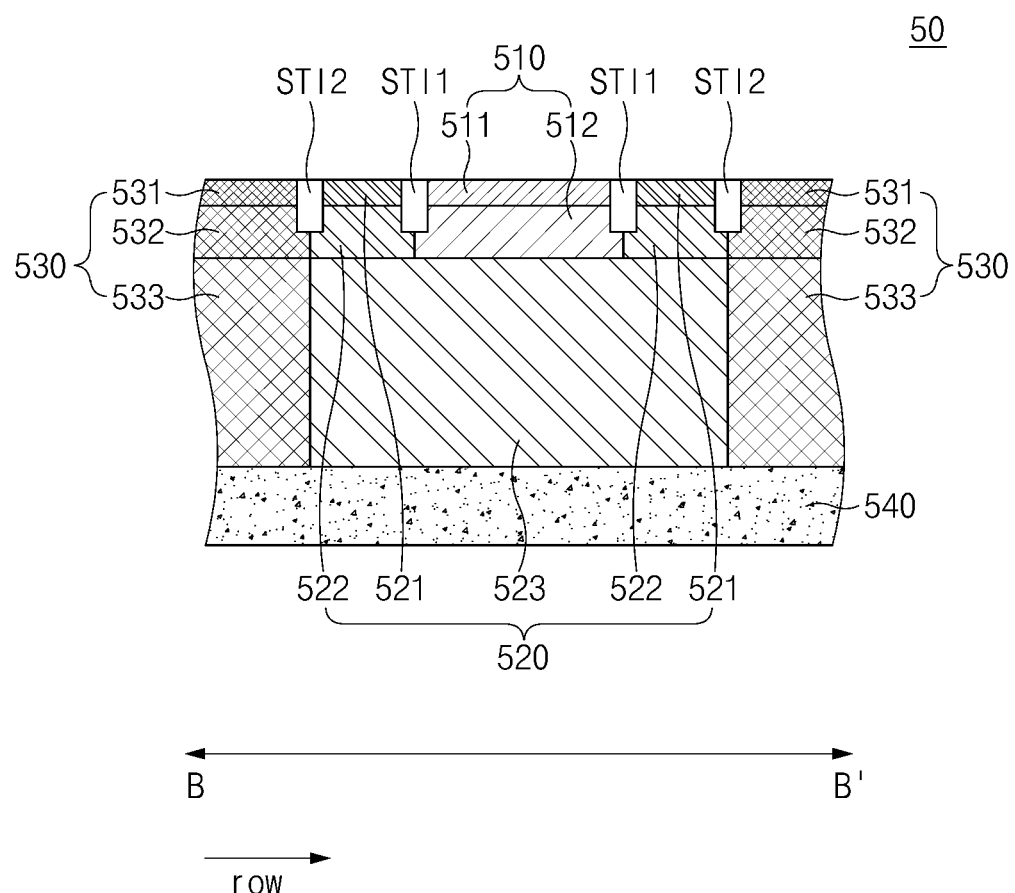
FIG. 5 is a cross-sectional view illustrating an example of a first protection device based on some implementations of the disclosed technology.

FIG. 5 is a cross-sectional view illustrating an example of the first protection device 500-1 based on some implementations of the disclosed technology.

FIG. 5 is a cross-sectional view 50 illustrating an example of the first protection device taken along a second cutting line B-B' shown in FIG. 4.

The remaining components of the cross-sectional view 50 of the first protection device other than the first STI (STI1) structure and the second STI (STI2) structure shown in FIG. 5 may be substantially identical in structure to the cross-sectional view 30 of the first protection device shown in FIG. 3, and as such redundant description thereof will herein be omitted for brevity, and the first protection device shown in FIG. 5 will hereinafter be described centering upon characteristics different from those of the first protection device shown in FIG. 3.

The first STI (STI1) structure may isolate the contact portion 511 and the floating portion 521 from each other. The second STI (STI2) structure may isolate the floating portion 521 and the ground voltage terminal portion 531 from each other.

The depth of the first STI (STI1) structure and the depth of the second STI (STI2) structure may be changed according to characteristics requisite for protection devices. Each of the first STI (STI1) structure and the second STI (STI2) structure may be formed to have at least a specific depth where the contact portion 511 and the floating portion 521 can be isolated from each other and the floating portion 521 and the ground voltage terminal portion 531 can be isolated from each other.

Since the contact portion 511, the floating portion 521, and the ground voltage terminal portion 531, each of which is used as a high-density doped region, are isolated from each another by the first STI (STI1) structure and the second STI (STI2) structure breakdown voltage reduction caused by a junction between the high-density doped regions can be prevented.

In addition, the first STI (STI1) structure may prevent the punch-through phenomenon between the contact portion 511 and the second well 522 in the image sensing device. When a voltage is applied to the contact portion 511, a spatial charge region disposed below the contact portion 511 may increase in width, such that the spatial charge region can extend to penetrate the second well 522. In order to prevent the punch-through phenomenon causing current leakage by the BJT (or diode) of each protection device, the contact portion 511 and the second well 522 may be spaced apart from each other by a predetermined distance through the first STI (STI1) structure.

Figure 6:
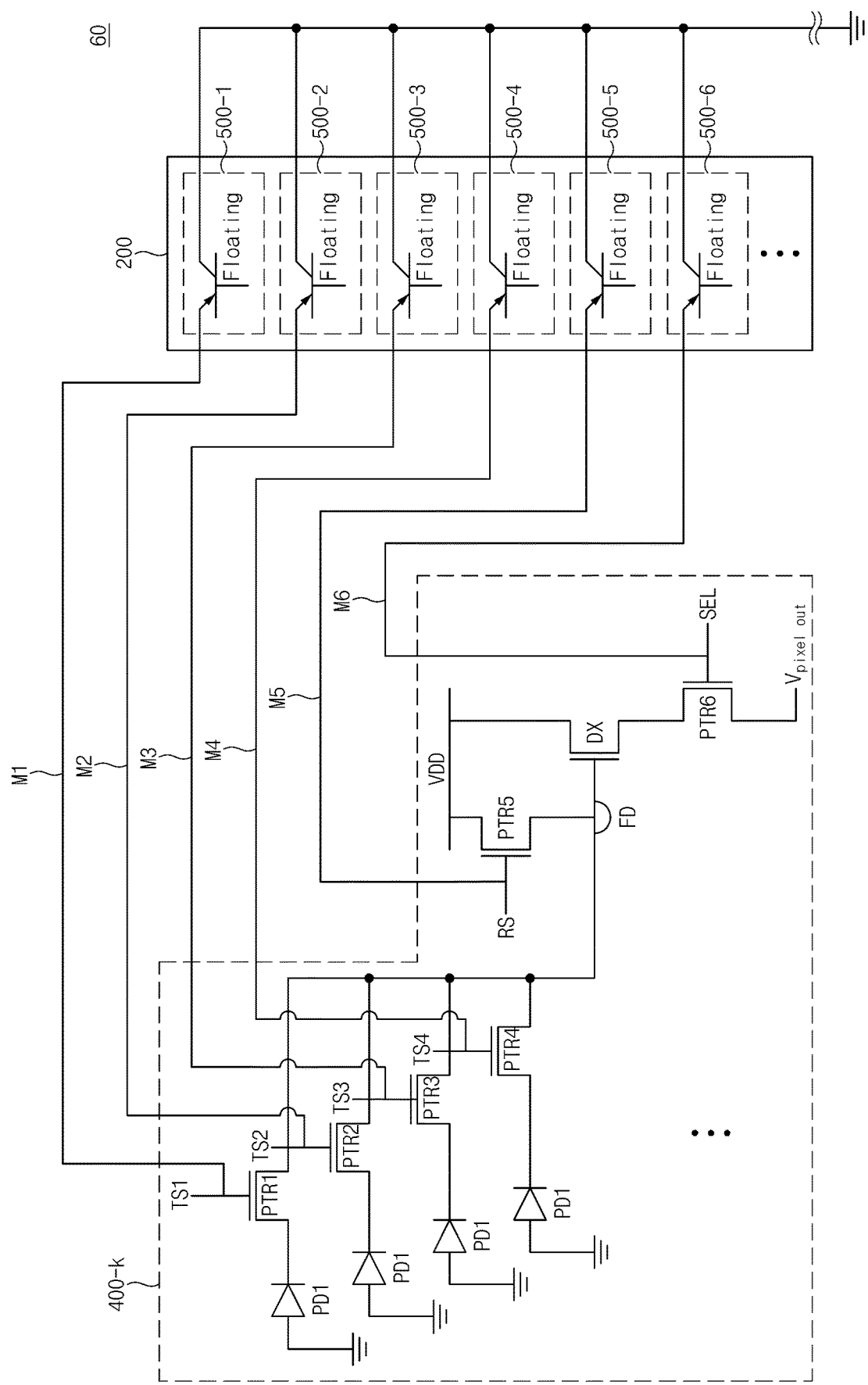
FIG. 6 is a circuit diagram illustrating an example of the image sensing device based on some implementations of the disclosed technology.

FIG. 6 is a circuit diagram illustrating an example of the image sensing device based on some implementations of the disclosed technology.

In some implementations, an example of unit pixel 400-*k* (where 'k' is a positive integer) included in the pixel array may be implemented as discussed below. In one example, first to sixth protected transistors PTR1 to PTR6 acting as protected transistors included in each unit pixel, control signals TS1, TS2, TS3, TS4, RS, and SEL respectively applied to the first to sixth protected transistors PTR1 to PTR6, and first to fourth photodiodes PD1 to PD4 included in the unit pixel 400-*k* may be implemented as illustrated in FIG. 6. In some implementations, the example of unit pixel 400-*k* may further include one or more transistors (e.g., a transistor for dual conversion gain, etc.).

Although FIG. 6 illustrates one unit pixel 400-*k* provided with the first to fourth photodiodes PD1 to PD4, and illustrates a shared pixel structure in which the first to fourth photodiodes PD1 to PD4 are formed to share one floating diffusion (FD) region through the first to fourth protected transistors PTR1 to PTR4, the scope of the disclosed technology is not limited thereto, and it should be noted that a shared pixel structure including two photodiode s structured to share one floating diffusion(FD) region or a unit pixel including photodiodes that do not share a floating diffusion (FD) region can also be implemented. In some implementations, the floating diffusion (FD) region may be used to hold photon-generated electrons when the photon-generated electrons are transferred through a transfer transistor to the floating diffusion (FD) region as a result of the voltage difference existing between the photodiode and floating diffusion (FD) region.

The first to fourth protected transistors PTR1 to PTR4 respectively coupled to the first to fourth photodiodes PD1 to PD4 may be transfer transistors. The first to fourth protected transistors PTR1 to PTR4 may receive first to fourth transfer transistor control signals TS1 to TS4, respectively.

The first to fourth protected transistors PTR1 to PTR4 may transmit photocharges generated by the first to fourth photodiodes PD1 to PD4 to the floating diffusion (FD) region according to logic levels (e.g., a logic high level and/or a logic low level) of the first to fourth transfer transistor control signals TS1 to TS4.

The fifth protected transistor PTR5 may be a reset transistor. The fifth protected transistor PTR5 may reset each of the connected devices (or elements) to a power-supply voltage (VDD) level according to a logic level of the received reset transistor control signal (RS). By turning on the reset transistor, the amount of photocharges generated by the first photodiode PD1, the amount of photocharges generated by the second photodiode PD2, the amount of photocharges generated by the third photodiode PD3, and the amount of photocharges generated by the fourth photodiode PD4 can be accurately measured.

The sixth protected transistor PTR6 may be a selection transistor. The sixth protected transistor PTR6 may generate an output voltage ($V_{pixel\_out}$) of a drive transistor (DX) according to a logic level of the received selection transistor control signal (SEL). In addition, the protection device region 200 may include the first to sixth protection devices 500-1 to 500-6 respectively corresponding to the first to sixth protected transistors PTR1 to PTR6.

The gates of the first to sixth protected transistors PTR1 to PTR6 may be respectively coupled to the first to sixth metal lines M1 to M6 separately from signal lines receiving the control signals TS1, TS2, TS3, TS4, RS, and SEL. The first to sixth metal lines M1 to M6 may be coupled to the first to sixth protection devices 500-1 to 500-6, respectively.

For example, the first transfer control signal (TS1) may be applied to the gate of the first protected transistor PTR1, and the gate of the first protected transistor PTR1 may be coupled to the first protection device 500-1 through the first metal line M1.

Each of the first to sixth protection devices 500-1 to 500-6 may be implemented as a BJT element provided with an emitter, a base, and a collector. Emitters of the first to sixth protection devices 500-1 to 500-6 may be respectively coupled to the gates of the first to sixth protected transistors PTR1 to PTR6. In addition, bases of the first to sixth protection devices 500-1 to 500-6 may float, and collectors of the first to sixth protection devices 500-1 to 500-6 may be grounded.

During the sensing operation of the image sensing device, control signals TS1, TS2, TS3, TS4, RS, and SEL may be respectively applied to the gates of the first to sixth protected transistors PTR1 to PTR6.

Each of the control signals TS1, TS2, TS3, TS4, RS, and SEL may have two logic levels (i.e., a logic high level and a logic low level). If a control signal having a logic high level is applied to the gate of each transistor, the corresponding transistor may be activated (or turned on). If a control signal having a logic low level is applied to the gate of each transistor, the corresponding transistor may be deactivated (or turned off).

Each of the control signals TS1, TS2, TS3, TS4, RS, and SEL may be a voltage signal. Therefore, the control signals TS1, TS2, TS3, TS4, RS, and SEL respectively applied to the gates of the first to sixth protected transistors PTR1 to PTR6 may affect the first to sixth protection devices 500-1 to 500-6 respectively coupled to the first to sixth protected transistors PTR1 to PTR6.

If the breakdown voltages of the first to sixth protection devices 500-1 to 500-6 are not sufficiently high, leakage current flowing from the first to sixth protection devices 500-1 to 500-6 to the protected transistors PTR1 to PTR6 may occur by a voltage applied to the gates of the protected transistors PTR1 to PTR6, causing noise in the image sensing device 10 due to such leakage current.

The first to sixth protection devices 500-1 to 500-6 based on some implementations of the disclosed technology can maintain the breakdown voltage range at a desired range, such that the voltage range applied to the gates of the protected transistors PTR1 to PTR6 may increase, providing necessary characteristics to the protection devices in the image sensing device 10.

Figure 7:
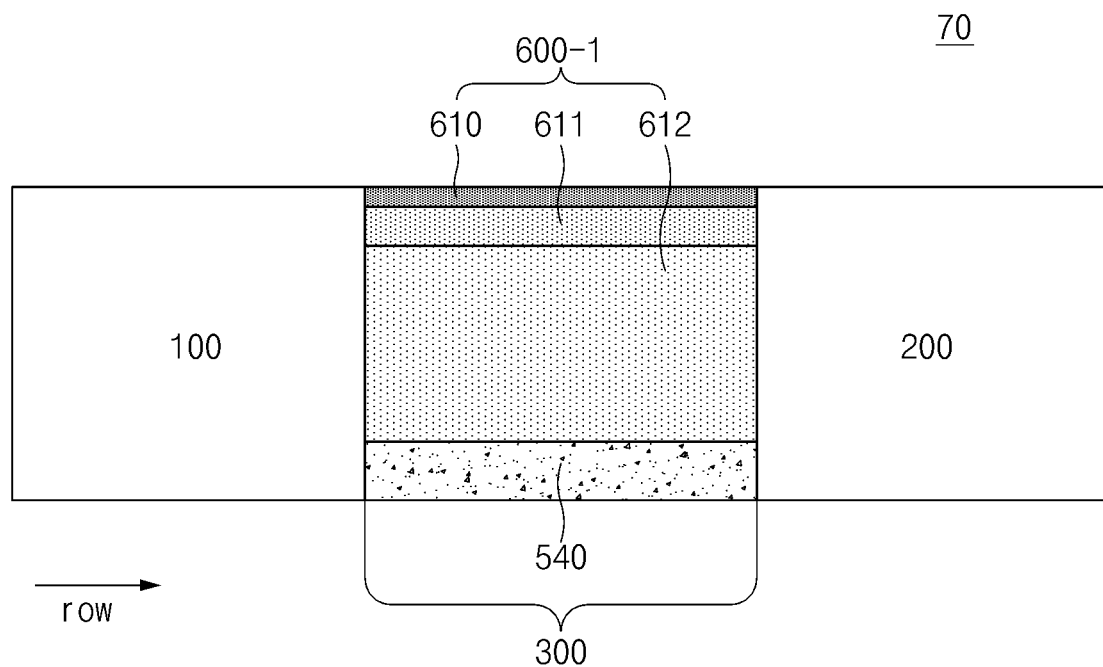
FIG. 7 is a cross-sectional view illustrating an example of an isolation region based on some implementations of the disclosed technology.

FIG. 7 is a cross-sectional view 70 illustrating an example of an isolation region 300 based on some implementations of the disclosed technology.

For convenience of description, the pixel array 100 and the protection device region 200 are briefly illustrated in FIG. 7.

Referring to FIG. 7, the isolation region 300 may be disposed between the pixel array 100 and the protection device region 200. As described above, since the isolation region 300 is disposed between the pixel array 100 and the protection device region 200, charges flowing into the semiconductor substrate 540 through the protection device region 200 during the plasma process may not affect the unit pixels disposed in the pixel array 100.

The isolation region 300 may include a first isolation portion 600-1 doped with first conductive impurities. Here, the first conductive impurities may be P-type impurities. The first isolation portion 600-1 may include a plurality of regions having different doping densities.

The first isolation portion 600-1 may include a first surface isolation portion 610, a first well isolation portion 611, and a first deep-well isolation portion 612.

The first surface isolation portion 610 may be located at the uppermost end of the first isolation portion 600-1, and may be grounded.

The first well isolation portion 611 may be disposed below the first surface isolation portion 610. The first deep-well isolation portion 612 may be disposed below the first well isolation portion 611. The semiconductor substrate 540 may be disposed below the first deep-well isolation portion 612.

The first conductive impurities may be identical to conductive impurities of the semiconductor substrate 540.

The first surface isolation portion 610 may be doped with a higher density than the first well isolation portion 611. Since the first surface isolation portion 610 is doped with a higher density, resistance between a conductive line through which a ground voltage is applied and the first surface isolation portion 610 may be reduced.

Since the first isolation portion 600-1 is doped with first conductive impurities, holes generated by the protection device region 200 can be easily captured.

Figure 8:
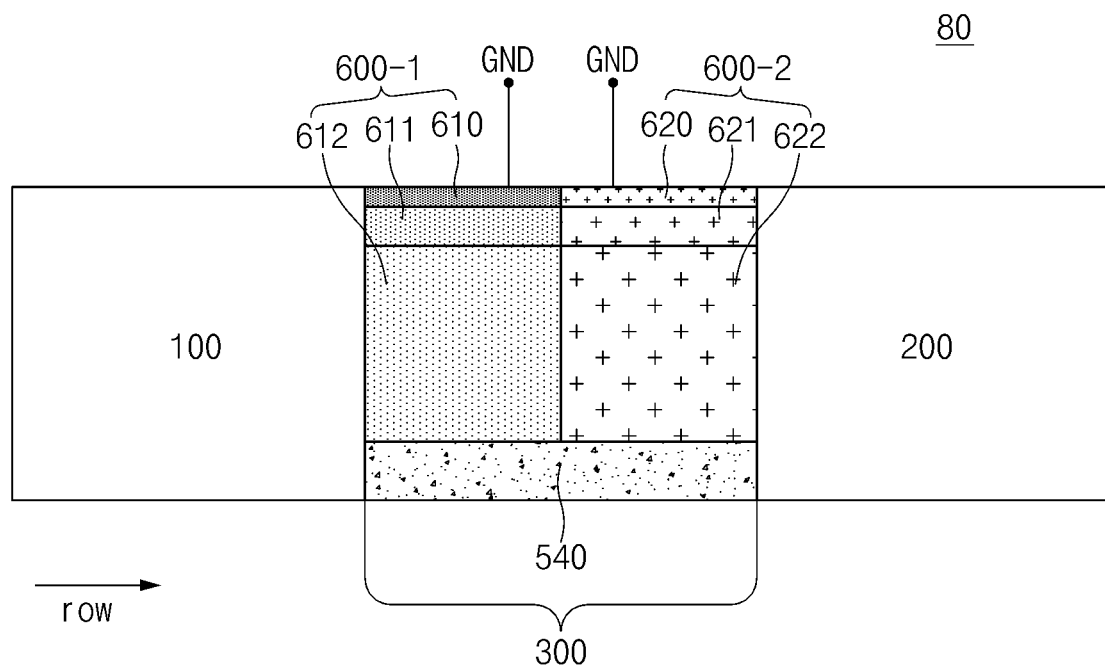
FIG. 8 is a cross-sectional view illustrating an example of an isolation region based on some implementations of the disclosed technology.

FIG. 8 is a cross-sectional view 80 illustrating an example of an isolation region 300 based on some implementations of the disclosed technology.

Referring to FIG. 8, the isolation region 300 may include a first isolation portion 600-1 and a second isolation portion 600-2. In some implementations, the first isolation portion 600-1 shown in FIG. 8 may be identical or similar to that of FIG. 7. The second isolation portion 600-2 will be discussed below by way of example.

In some implementations, the first isolation portion 600-1 may be formed between the pixel array 100 and the second isolation portion 600-2 due to formation of the second isolation portion 600-2.

The isolation region 300 may include the first isolation portion 600-1 doped with first conductive impurities and the second isolation portion 600-2 doped with second conductive impurities. The second conductive impurities may be N-type impurities. The second isolation portion 600-2 may include a plurality of regions having different doping densities.

The second isolation portion 600-2 may include a second surface isolation portion 620, a second well isolation portion 621, and a second deep-well isolation portion 622.

The second surface isolation portion 620 may be located at the uppermost end of the second isolation portion 600-2, and may be grounded.

The second well isolation portion 621 may be disposed below the second surface isolation portion 620. The second deep-well isolation portion 622 may be disposed below the second well isolation portion 621. The semiconductor substrate 540 may be disposed below the second deep-well isolation portion 622.

The second conductive impurities may be impurities that are opposite in type to those of the semiconductor substrate 540.

The second surface isolation portion 620 may be doped with a higher density than the second well isolation portion 621. Since the second surface isolation portion 620 is doped with a higher density, resistance between the conductive line and the second surface isolation portion 620 may be reduced during connection between the second surface isolation portion 620 and the ground voltage terminal.

Since the second isolation portion 600-2 is doped with second conductive impurities, electrons generated by each protection device can be easily captured. As the first isolation portion 600-1 is located closer to the pixel array 100 than the second isolation portion 600-2, holes generated from the protection device region 200 can be captured by the first isolation portion 600-1 after capturing electrons by the second isolation portion 600-2.

The isolation region 300 may include the first isolation portion 600-1 and the second isolation portion 600-2, such that the isolation region 300 can capture electrons and holes. As a result, devices or elements included in the pixel array 100 can be electrically protected.

Figure 9:
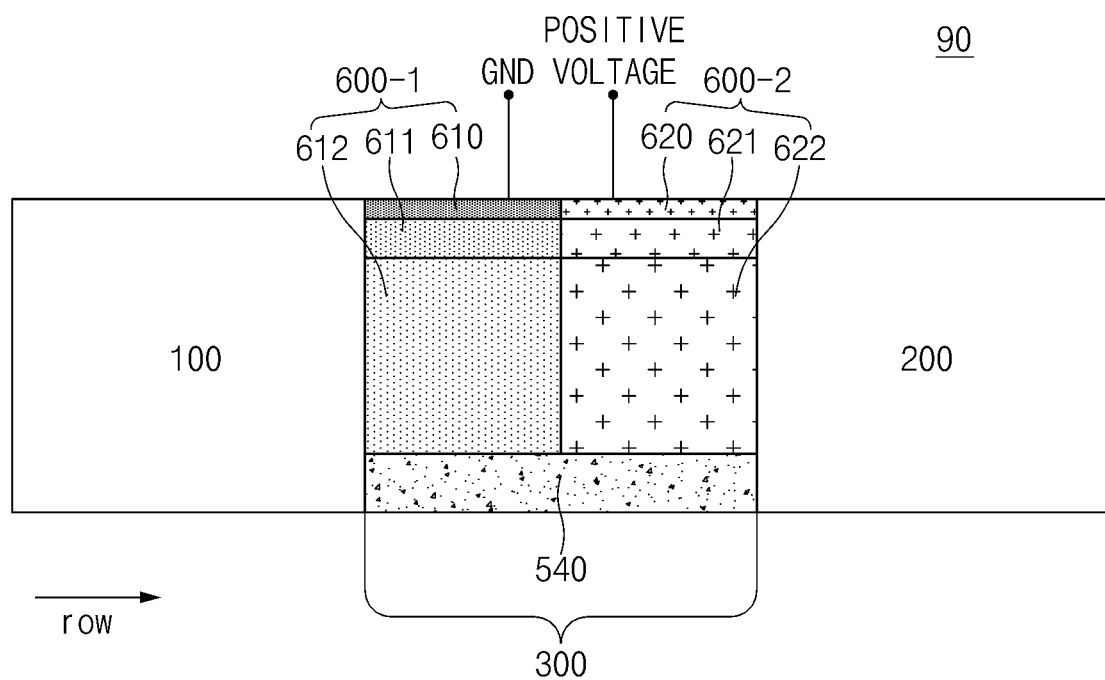
FIG. 9 is a cross-sectional view illustrating an example of an isolation region based on some implementations of the disclosed technology.

FIG. 9 is a cross-sectional view illustrating an example of an isolation region 300 based on some implementations of the disclosed technology.

Referring to FIG. 9, the isolation region 300 may include a first isolation portion 600-1 and a second isolation portion 600-2. The first isolation portion 600-1 and the second isolation portion 600-2 shown in FIG. 9 are identical or similar in structure to those of FIG. 8. The voltage applied to the second isolation portion 600-2 will be discussed below.

Since a positive (+) voltage is applied to the second surface isolation portion 620 of the second isolation portion 600-2, the electron capture capability of the second isolation portion 600-2 may be improved as compared to the other case in which the ground voltage is applied to the second surface isolation portion 620 of the second isolation portion 600-2.

As is apparent from the above description, the image sensing device provided with the protection device based on some implementations of the disclosed technology can effectively protect the protected transistor during the plasma process, and at the same time does not affect the operation of the protected transistor.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:
   a plurality of unit photosensing pixels structured to convert light into electrical signals, each of the plurality of unit photosensing pixels including a photosensor and a plurality of transistors structured to perform operations associated with the photosensor;
   a plurality of protection devices, each of which is coupled to any one of the plurality of transistors; and
   an isolation region disposed between a region in which the plurality of protection devices is disposed and a region in which the plurality of unit photosensing pixels is disposed,
   wherein each of the plurality of protection devices includes:
   a first region doped with a first type of conductive impurities;
   a second region doped with a second type of conductive impurities and surrounding the first region; and
   a third region doped with the first type of conductive impurities and surrounding the second region, wherein the first region includes a contact portion and a first well located below the contact portion, and wherein the contact portion has a higher doping density than the first well, and is coupled to any one of the plurality of transistors, and wherein the isolation region includes:
a first isolation portion doped with the first type of conductive impurities; and
a second isolation portion doped with the second type of conductive impurities,
wherein the second isolation portion is disposed between a region in which the first isolation portion is disposed and the region in which the plurality of protection devices is disposed, and the second isolation portion is configured to receive a positive voltage, and
wherein the first isolation portion is configured to receive a ground voltage.

2. The image sensing device according to claim 1, wherein:
the first type of conductive impurities is P-type impurities; and
the second type of conductive impurities is N-type impurities.

3. The image sensing device according to claim 1, wherein:
the second region includes a floating portion, a second well located below the floating portion, and a first deep well located below the second well,
wherein the floating portion has a higher doping density than the second well.

4. The image sensing device according to claim 3, wherein:
the second well is arranged to contact the first well; and
the contact portion has a higher doping density than the second well.

5. The image sensing device according to claim 3, further comprising:
a shallow trench isolation (STI) structure arranged between the contact portion and the floating portion and structured to isolate the contact portion and the floating portion from each other.

6. The image sensing device according to claim 3, wherein the third region includes a ground voltage terminal portion, a third well located below the ground voltage terminal portion, and a second deep well located below the third well, wherein the ground voltage terminal portion has a higher doping density than the third well.

7. The image sensing device according to claim 6, wherein:
the third well is arranged to contact the second well; and
the contact portion has a higher doping density than the third well.

8. The image sensing device according to claim 6, further comprising:
a shallow trench isolation (STI) structure by which the floating portion and the contact portion are isolated from each other.

9. The image sensing device according to claim 1, wherein:
each of the plurality of transistors is any one of a transfer transistor, a selection transistor, or a reset transistor.

10. An image sensing device comprising:
a plurality of photosensors structured to convert light into electrical signals;
a plurality of transistors structured to perform operations associated with the plurality of photosensors; and
a plurality of protection devices structured to carry electric charges accumulated in the plurality of transistors to a semiconductor substrate by connecting to gates of the plurality of transistors,
an isolation region disposed between a region in which the plurality of protection devices is disposed and a region in which a plurality of unit photosensing pixels is disposed,
wherein each of the plurality of protection devices includes:
a contact portion doped with P-type impurities;
a first well doped with the P-type impurities, and formed below the contact portion;
a second well doped with N-type impurities, and formed to contact the first well by surrounding the first well; and
a first deep well doped with the N-type impurities, and formed below the second well,
wherein:
the first deep well is formed between the semiconductor substrate and the first well; and
each of the first well and the second well is doped with a lower density than the contact portion, and
wherein the isolation region includes:
a first isolation portion doped with the P-type impurities; and
a second isolation portion doped with the N-type impurities,
wherein the second isolation portion is disposed between a region in which the first isolation portion is disposed and the region in which the plurality of protection devices is disposed, and the second isolation portion is configured to receive a positive voltage, and
wherein the first isolation portion is configured to receive a ground voltage.

11. The image sensing device according to claim 10, wherein each of the plurality of protection devices includes:
a third well doped with the P-type impurities, and formed to contact the second well by surrounding the second well; and
a second deep well doped with the P-type impurities, and formed below the third well.

12. An image sensing device comprising:
a plurality of photosensors structured to convert light into electric charges;
a plurality of first devices structured to accumulate the electric charges generated by plurality of photosensors; and
a plurality of second devices structured to carry the electric charges accumulated in the plurality of first devices,
an isolation region disposed between a region in which the plurality of first devices is disposed and a region in which the plurality of second devices is disposed,
wherein each of the plurality of second devices includes:
a first region doped with a first type of conductive impurities;
a second region doped with a second type of conductive impurities and surrounding the first region; and
a third region doped with the first type of conductive impurities and surrounding the second region,
wherein the first region includes a contact portion and a first well located below the contact portion, and
wherein the contact portion has a higher doping density than the first well, and is coupled to any one of the plurality of first devices, and wherein the isolation region includes:
a first isolation portion doped with the first type of conductive impurities; and
a second isolation portion doped with the second type of conductive impurities,
wherein the second isolation portion is disposed between a region in which the first isolation portion is disposed and the region in which the plurality of second devices is disposed, and the second isolation portion is configured to receive a positive voltage, and
wherein the first isolation portion is configured to receive a ground voltage.

13. The image sensing device according to claim 12, wherein:
the first type of conductive impurities is P-type impurities; and
the second type of conductive impurities is N-type impurities.

14. The image sensing device according to claim 12, wherein:
the second region includes a floating portion, a second well located below the floating portion, and a first deep well located below the second well,
wherein the floating portion has a higher doping density than the second well.

15. The image sensing device according to claim 14, wherein:
the second well is arranged to contact the first well; and
the contact portion has a higher doping density than the second well.

* * * * *